United States Patent [19]

Ugajin

[11] Patent Number: 5,719,407
[45] Date of Patent: Feb. 17, 1998

[54] COLLECTIVE ELEMENT OF QUANTUM BOXES

[75] Inventor: Ryuichi Ugajin, Kanagawa, Japan

[73] Assignee: Sony Corporation, Tokyo, Japan

[21] Appl. No.: 535,814

[22] Filed: Sep. 28, 1995

Related U.S. Application Data

[63] Continuation of Ser. No. 197,308, Feb. 16, 1994, abandoned.

[30] Foreign Application Priority Data

Feb. 26, 1993 [JP] Japan .................. 5-063090

[51] Int. Cl.⁶ .................. H01L 29/205; H01L 29/88
[52] U.S. Cl. .................. 257/21; 257/22; 257/17; 257/25; 365/114; 365/215
[58] Field of Search .................. 257/14, 17, 21, 257/23, 24, 25, 20, 28, 104, 105, 192, 22; 385/130, 131, 14; 365/104, 114, 215; 372/7, 8, 43, 45, 46, 47, 50

[56] References Cited

U.S. PATENT DOCUMENTS

| | | | |
|---|---|---|---|
| 4,799,091 | 1/1989 | Reed | 257/25 |
| 4,972,370 | 11/1990 | Morimoto et al. | 257/28 |
| 5,126,804 | 6/1992 | Nagai et al. | 257/21 |
| 5,187,715 | 2/1993 | Weisbuch | 257/21 |
| 5,298,108 | 3/1994 | Miller | 372/43 |

FOREIGN PATENT DOCUMENTS

| | | | |
|---|---|---|---|
| 3-203267 | 9/1991 | Japan . | |
| 4-69980 | 3/1992 | Japan | 257/14 |
| 2256313 | 12/1992 | United Kingdom | 257/14 |

*Primary Examiner*—Jerome Jackson
*Assistant Examiner*—John Guay
*Attorney, Agent, or Firm*—Hill, Steadman & Simpson

[57] ABSTRACT

A collective element of quantum boxes includes a plurality of the first quantum boxes ($QD_1$) arranged within the first surface, between which conduction of electrons is allowed, a plurality of the second quantum boxes ($QD_2$) arranged within the second surface corresponding to the plural first quantum boxes ($QD_1$) between which conduction of electrons and holes is not substantially allowed, and a plurality of the third quantum boxes ($QD_3$) arranged within the third surface corresponding to the plural second quantum boxes ($QD_2$), between which conduction of holes is allowed.

7 Claims, 8 Drawing Sheets

COLLECTIVE ELEMENT OF QUANTUM BOXES

This is a continuation of application Ser. No. 08/197,308, filed Feb. 16, 1994 now abandoned.

BACKGROUND

1. Field of the Invention

The present invention relates to a collective element of quantum boxes.

2. Background of the Invention

Recently, in the field of quantum wave electronics, attention has been paid to the so-called quantum box which has an extremely small structure with a cross sectional dimension which is approximately the same as a de Broglie wavelength of an electron. People have been very interested in the quantum effect which is shown by a zero dimensional electron kept in this quantum box.

The collective element of quantum boxes is made of a plurality of these quantum boxes combined with each other. The element is intended to perform data processing through varying the distribution of electrons by causing a tunneling (in the meaning of quantum mechanics) of an electron between the quantum boxes.

In such a collective element of quantum boxes, data processing is performed by conducting an electron between the quantum boxes. However, flexibility of designing this collective element of quantum boxes could be increased if it would be possible for a hole, in addition to an electron, to be conducted between the quantum boxes and result in data processing. Though both electrons and holes can be simply conducted, the electron and hole may stay in the quantum box while being conducted and re-couple to each other. This results in less than desirable operation because of the decreased number of electrons and holes.

SUMMARY OF THE INVENTION

It is, therefore, an object of the present invention to provide a collective element of quantum boxes which enables both electrons and holes to be respectively conducted without re-coupling to each other.

It is another object of the present invention to provide a collective element of quantum boxes which can be used for for data processing.

It is a further object of the present invention to provide a collective element of quantum boxes for which flexibility of design can be increased.

In one aspect of the present invention, a collective element of quantum boxes includes a plurality of first quantum boxes ($QD_1$) arranged within a first surface, between which conduction of electrons is allowed, a plurality of the second quantum boxes ($QD_2$) arranged within a second surface corresponding to the plural first quantum boxes ($QD_1$) between which conduction of electrons and holes is substantially not allowed, and a plurality of the third quantum boxes ($QD_3$) arranged within the third surface corresponding to the plural second quantum boxes ($QD_2$), between which conduction of holes is allowed.

The first, second and third quantum boxes ($QD_1$, $QD_2$ and $QD_3$) may be respectively made of a superlattice of type I such as a hetero conjunction.

Further, a bias voltage is supplied so that it has a higher electric potential at the plural first quantum boxes ($QD_1$) than at the plural third quantum boxes ($QD_3$). Then, a selected one of the second quantum box ($QD_2$) is irradiated with a light which has a wavelength which provides resonant energy for generating an electron and hole pair in the second quantum box ($QD_2$). The initial distribution of the electron and hole is performed by this generation of the electron and hole pair.

The electron and hole pair is generated by irradiation of light into a selected one of the second quantum boxes ($QD_2$). Then, by supplying a larger bias voltage, it is moved respectively to the corresponding first and third quantum boxes ($QD_1$ and $QD_3$). Thus the initial distribution of electrons and holes is respectively transferred to the plural first and third quantum boxes ($QD_1$ and $QD_3$). Thereafter, data processing can be performed by conducting the electron among the plural first quantum boxes ($QD_1$) and also conducting the hole among the plural third quantum boxes ($QD_3$).

By substantially removing the bias voltage, the electron and hole are moved to the plural second quantum boxes ($QD_2$) respectively out of the plural first quantum boxes ($QD_1$) and third quantum boxes ($QD_3$). By observing luminescence caused by the re-coupling of the electron and hole at the respective second quantum boxes ($QD_2$), output can be obtained through the distribution of luminous intensity.

In accordance with this invention, the electron and hole pair generated by irradiation of light into the selected one of the second quantum box ($QD_2$) can be moved respectively to the corresponding first and third quantum boxes ($QD_1$ and $QD_3$). And the electron and hole are respectively conducted among the plural first and third quantum boxes ($QD_1$ and $QD_3$). Therefore, data processing can be performed in accordance with the location of the plural first and third quantum boxes ($QD_1$ and $QD_3$) which are located within different surfaces. Both the electron and hole can be involved in the data processing. The flexibility of designing this collective element of quantum boxes is therefore increased.

The first, second and third quantum boxes ($QD_1$, $QD_2$ and $QD_3$) can be respectively made of a hetero conjunction superlattice of type I such as the hetero conjunction of AlGaAs/GaAs which can be easily formed by hetero spitaxial growth. It thus becomes easy to manufacture the collective element of quantum boxes.

Furthermore, data can be entered by irradiating a light into the second quantum boxes ($QD_2$). Then it is retrieved as luminescence caused by the re-coupling of the electron out of the first quantum box ($QD_1$) corresponding to the second quantum box ($QD_2$). and the hole out of the corresponding third quantum box ($QD_3$) Optical data entry and retrieval can be so realized in the collective element of quantum boxes.

DESCRIPTION OF THE INVENTION

A collective element of quantum dots as an embodiment of the invention will be explained with reference to FIG. 1. In a general terminology, a quantum box can contain one or more electrons. In quantum box technology, a box refers to a quantum dot in which only one electron can be contained. An element can be made of a plurality of the combined quantum dots and is called collective element of quantum dots.

Figure 1:
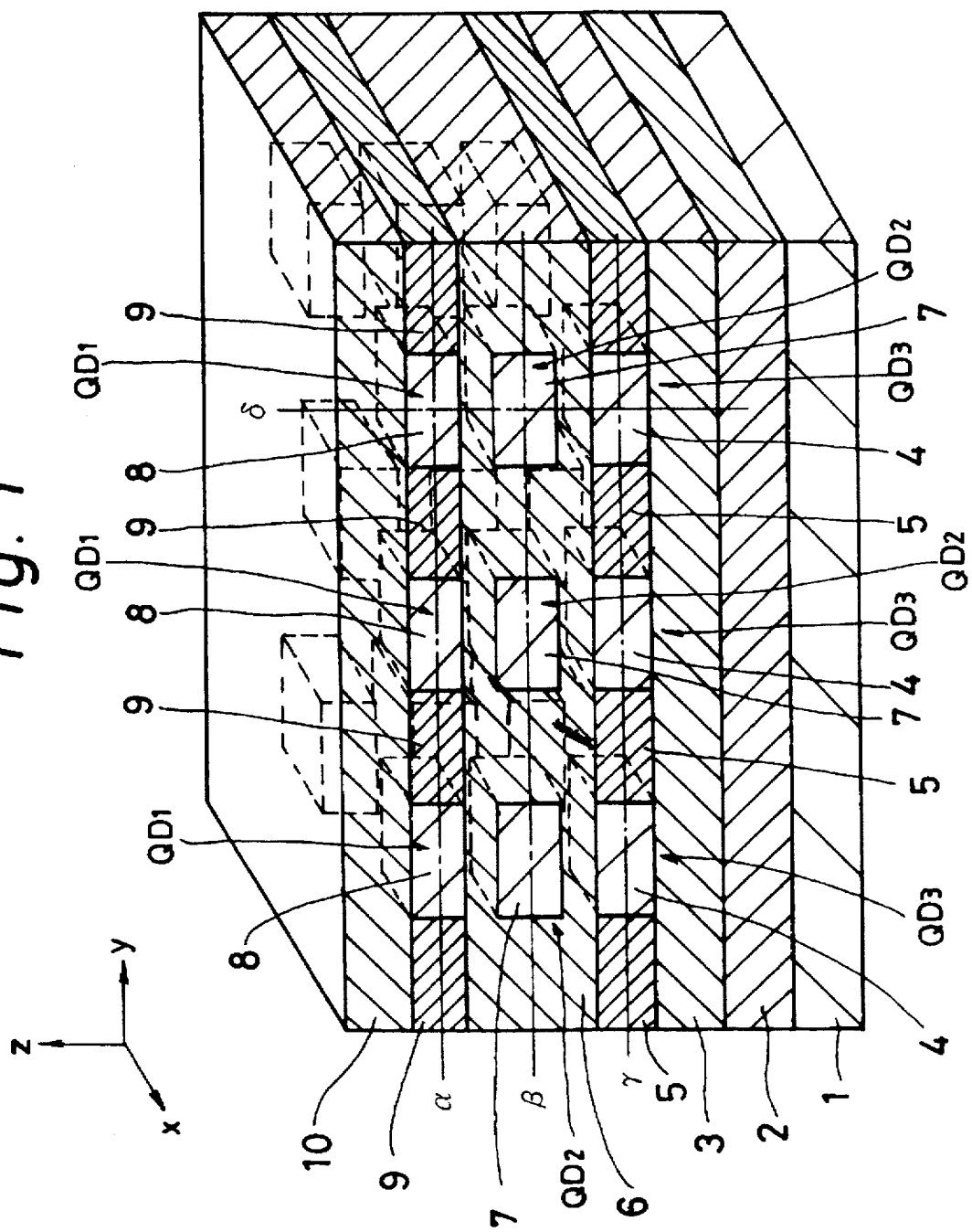
FIG. 1 shows a perspective view of a collective element of quantum dot as an embodiment of the invention.

In a collective element of quantum dots of the embodiment shown in FIG. 1, an electrode for supplying a bias voltage is formed by a n-type GaAs layer 2 on a semi-isolated GaAs substrate 1. An AlAs layer 3 is formed as a barrier layer on the n-type GaAs layer 2. A plurality of box-like GaAs layer 4 are formed on the AlAs layer 3 as a well layer with a certain pattern of array within a surface parallel to a x-y plane. Between these GaAs structures 4, AlGaAs layers structures 5 are filled as barrier. Another AlAs layer 6 is laid as a barrier layer on the structures of GaAs 4 and AlGaAs layers 5. In the AlAs layer 6, box-like GaAs layers 7 are buried as well layers at the locations corresponding to the GaAs layers 4. Box-like GaAs layers 8 as well layers are formed with a pattern of array on the AlAs layer 6 at the locations corresponding to the GaAs layers 7. Between these GaAs layers 8, AlGaAs layers 9 are filled as barrier layers. A further AlAs layer 10 is laid as a barrier layer on both the GaAs layers 8 and AlGaAs layers 9.

Within a plane parallel to the surface of substrate 1, in other words along the directions of x-axis and y-axis, the width of GaAs layer 4, GaAs layer 7 and GaAs layer 8 are all same as each other. However, along the direction perpendicular to the surface of substrate 1, in other words along the direction of z-axis, the thickness of GaAs layer 7 is larger than that of GaAs layer 4 or GaAs layer 8. In this embodiment, the thickness of GaAs layer 4 and GaAs layer 8 are same along the direction of z-axis which is perpendicular to the surface of substrate 1.

In this embodiment in FIG. 1, quantum dots $QD_1$ are formed at the first row by the structure in which the GaAs layers 8 as well layers are surrounded by the AlAs layers 6, AlGaAs layers 9 and AlAs layers 10 as barrier layers. As will be described later, this array of the quantum dots $QD_1$ at the first row are utilized to conduct electrons so as to perform data processing. Other quantum dots $QD_2$ are formed at the second row by the structure in which the GaAs layers 7 as well layers are surrounded by the AlAs layers 6 as barrier layers. The locations of these quantum dots $QD_2$ at the second row correspond to the locations of quantum dots $QD_1$ at the first row. As will be described later, this array of the quantum dots $QD_2$ at the second row are utilized for the data entry by means of irradiation of light. Further quantum dots $QD_3$ are formed at the third row by the structure in which the GaAs layers 4 as well layers are surrounded by the AlAs layers 3, AlGaAs layers 5 and AlAs layers 6 as barrier layers. As will be described later, this array of the quantum dots $QD_3$ at the third row are utilized to conduct holes so as to perform the data processing.

The hereto junctions of either AlGaAs/GaAs or AlAs/GaAs of the quantum dots $QD_1$, $QD_2$ and $QD_3$ at the first, second and third rows are all hetero superlattice junctions of type I.

Though it is eliminated from FIG. 1 for simplicity, an electrode is formed on the AlAs layer 10 for supplying a bias voltage. This electrode is made of a metal or a transparent electrode material such as ITO (Indium-Tin Oxide). When this electrode is made of a metal, a plurality of openings are formed in the electrode at the locations corresponding to the quantum dots $QD_2$ at the second rows. The incident light for data entry becomes possible to the selected quantum dots $QD_2$ at the second row through these openings in the electrode.

Figure 2:
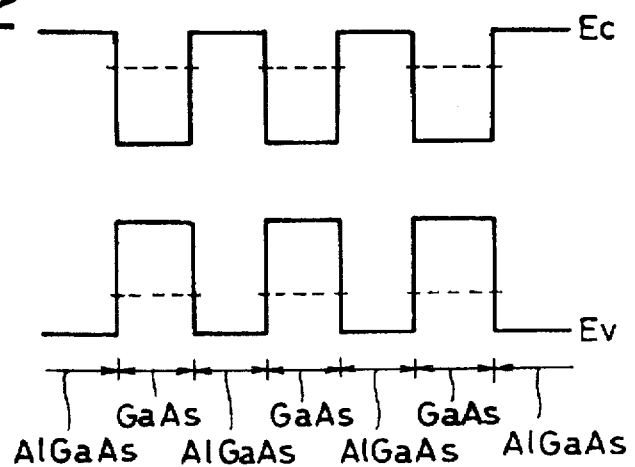
FIG. 2 shows an energy band along the directions represented by the lines α and γ in FIG. 1.

FIG. 2 shows an energy band along the directions represented by the lines α and γ in FIG. 1. In FIG. 2, $E_c$ and $E_v$ respectively show an energy at the lowest end of conduction band and an energy at the highest end of valence electron band (hereinafter, same definitions are applied to FIGS. 3 to 8). As understood by FIG. 2, height of potential barrier at the hetero conjunction of AlGaAs/GaAs is relatively small along directions of a line α which makes adjacent quantum dots $QD_1$ at the first row connected to each other and a line γ which makes adjacent quantum dots $QD_3$ at the third row. This means that strong couplings exist among the quantum dots $QD_1$ at the first row and among the quantum dots $QD_3$ at the third row. The conduction of electrons or holes is allowed by tunneling among quantum dots $QD_1$ at the first row and among quantum dots $QD_3$ at the third row. In FIG. 2, dotted lines in the conduction band shows a quantum level corresponding to a ground state of electron of the first quantum dots $QD_1$ and another dotted lines in the valence electron band shows another quantum level corresponding to a ground state of hole of the first quantum dots $QD_1$ (hereinafter, same definitions are applied to FIGS. 3 to 8).

Figure 3:
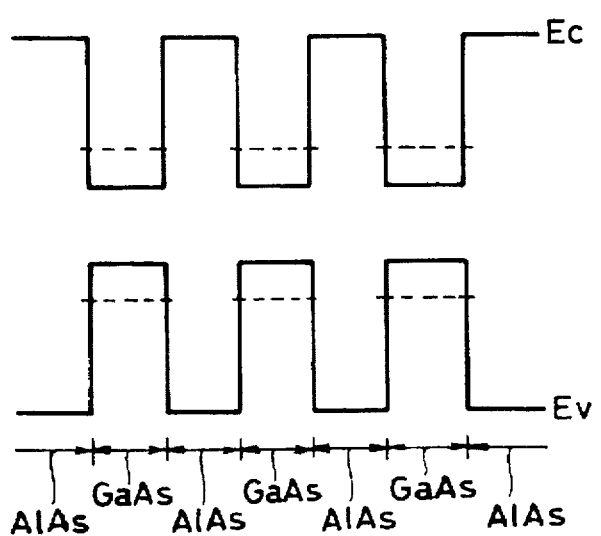
FIG. 3 shows an energy band along the direction represented by the line β in FIG. 1.

FIG. 3 shows an energy band along the direction represented by the line β in FIG. 1. As understood by FIG. 3, height of potential barrier at the hetero junction of AlAs/GaAs becomes relatively larger than that of AlGaAs/GaAs along a directions of line β which makes adjacent quantum dots $QD_2$ at the second row connected to each other. This means that very weak couplings exist among the quantum dots $QD_2$ at the second row. The conduction of electrons or holes is not therefore allowed by tunneling among these quantum dots $QD_2$ at the second row.

Figure 4:
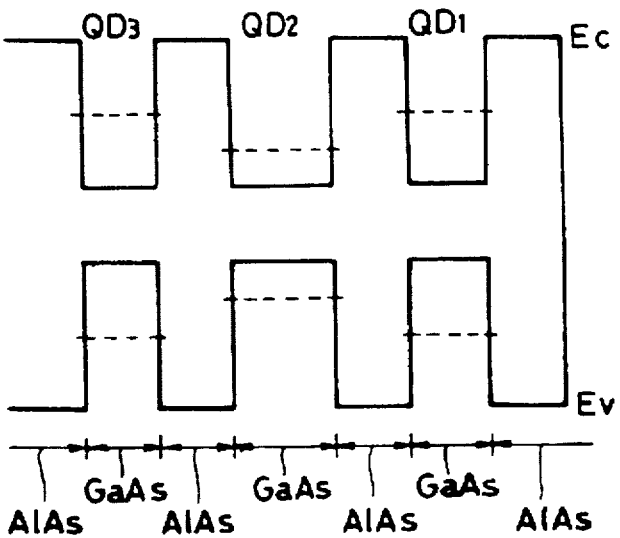
FIG. 4 shows an energy band along the direction represented by the line δ in FIG. 1.

FIG. 4 shows an energy band along the direction represented by the line δ in FIG. 1. As understood by FIG. 4, the energy of an electron in its ground state at the quantum dot $QD_2$ in the second row is lower than the energy of electron in its ground state at the quantum dots $QD_1$ and $QD_3$ at the first and third rows. Similarly, the energy of a hole in its ground state at the quantum dot $QD_2$ at the second row is lower than the energy of hole in its ground state at the quantum dots $QD_1$ and $QD_3$ at the first and third rows. This is caused by the different dimension along the line δ. As explained before, the thickness of the quantum dots $QD_2$ at the second row is larger than that of the quantum dots $QD_1$ and $QD_3$ at the first and third rows.

Next, the theoretical operation will be explained regarding the embodiment having the structure as described before with FIGS. 5 to 8.

Figure 5:
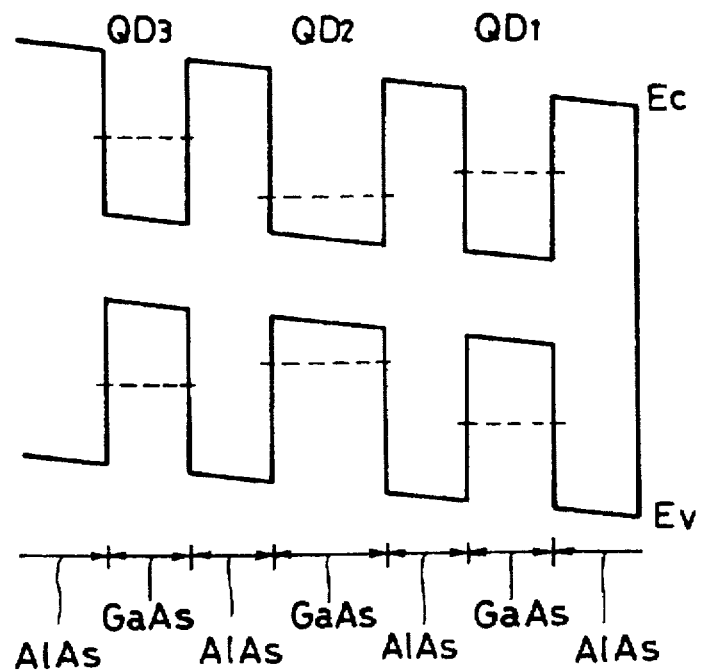
FIG. 5 shows an energy band for the purpose of explaining the method for data entry in the collective element of quantum dots shown in FIG. 1.
Figure 6:
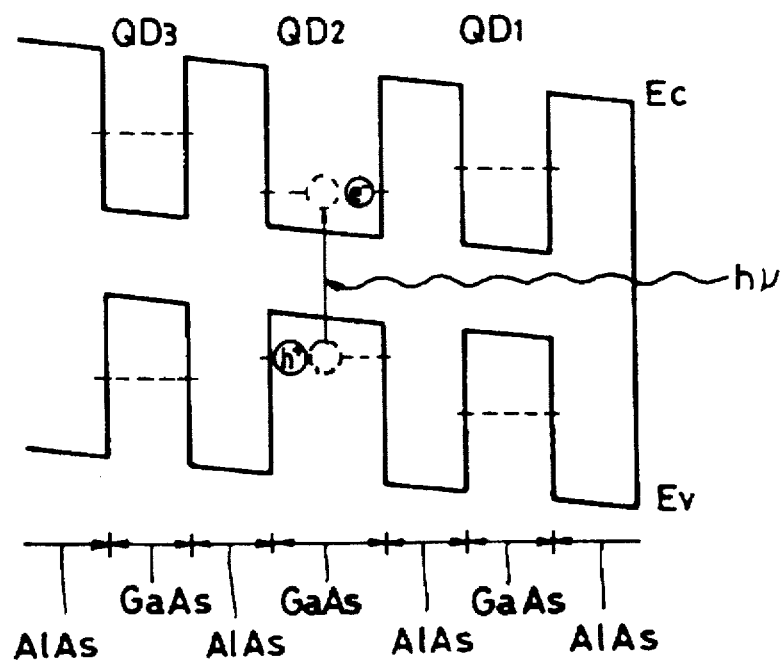
FIG. 6 also shows an energy band for the purpose of explaining method for data entry in the collective element of quantum dots shown in FIG. 1.

When data is to be entered, a bias voltage is supplied between the n-type GaAs layer 2 and the electrode (not shown in the drawings) on the AlAs layer 10 so that an electric potential of this electrode can be a little bit higher than that of the n-type GaAs layer 2. At this time, the energy band along the line δ in FIG. 1 becomes slanted a little as shown in FIG. 5. Then, in accordance with the data to be entered, certain quantum dots $QD_2$ in the second row are selected so that the selected quantum dots $QD_2$ can be irradiated, as shown in FIG. 6, by monochromatic light with a wavelength corresponding to the resonant energy for generating an electron and hole pair in the selected quantum dots $QD_2$ at the second row. An electron ($e^-$) and a hole ($h^+$) pair is thus generated. As understood in FIG. 6, an electron and a hole pair cannot be generated in the quantum dots $QD_1$ or $QD_3$ at the first or third row by a photon energy of this monochromatic light. Therefore, an electron and a hole pair can be generated only in the quantum dots $QD_2$ at the second row by irradiating the monochromatic light. In practice, this irradiation of the monochromatic light can be realized by utilizing a laser beam for an example, which has a sufficiently small diameter.

In this case, either the electron or hole which was generated in the quantum dots $QD_2$ by this irradiation of light cannot move out of the quantum dots $QD_2$ because of the high potential barrier of the AlAs layer 6. These electrons and holes in the quantum dots $QD_2$ are spatially separated by the electric field along a direction of z-axis, which is caused by the above mentioned bias voltage. Therefore, the probability to re-couple the pair of electron and hole generated by the irradiation of light is small.

The initial distribution of electrons and holes is thus performed by scanning the monochromatic light such as a laser beam at the selected quantum dots $QD_2$ in the second row and generating a pair of electrons and holes in each of them. These initial distribution of electrons and holes are the same as each other. They are represented by "f(x,y)".

Figure 7:
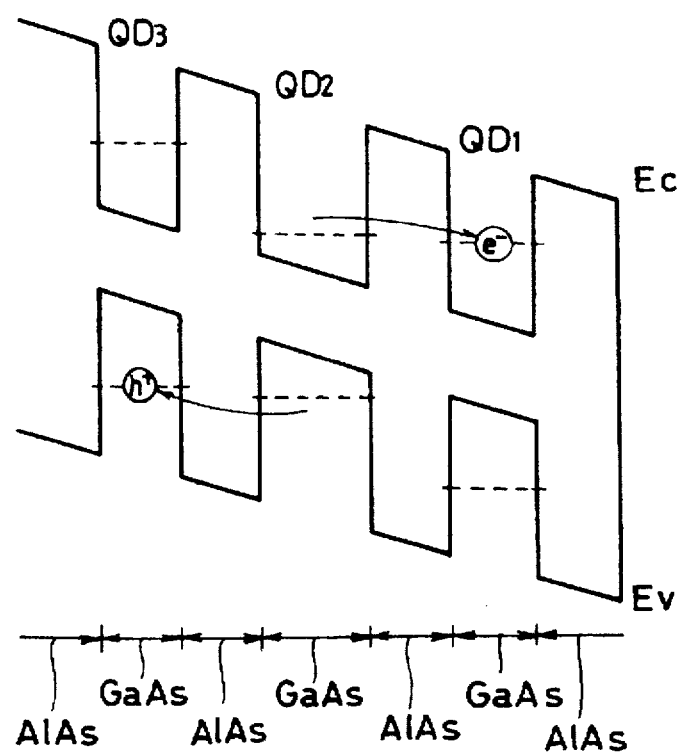
FIG. 7 shows an energy band for the purpose of explaining operation after data entry but before data processing of the collective element of quantum dots shown in FIG. 1.

After providing the array of quantum dots $QD_2$ in the second row with the initial distribution "f(x,y)" of electrons and holes, the bias voltage is larger between the n-type GaAs layer 2 and the electrode mounted on the AlAs layer 10. As a result, the energy band along the line δ in FIG. 1 becomes further slanted as shown in FIG. 7. Because of the electric field along a direction of z-axis caused by the bias voltage, the quantum level corresponding to a ground state an electron in the conduction band of the first quantum dots $QD_1$ in the first row becomes lower than the quantum level corresponding to a ground state of an electron in the conduction band of the second quantum dots $QD_2$ in the second row. The quantum level corresponding to a ground state of a hole in the valence electron band of the third quantum dots $QD_3$ in the third row becomes lower than the quantum level corresponding to a ground state of a hole in the valence electron band of the second dots $QD_2$ in the second row. Then the electrons in the second quantum dots $QD_2$ at the second row move all at once to the quantum dots $QD_1$ at the first row. Also, the holes in the second quantum dots $QD_2$ at the second row move all at once to the quantum dots $QD_3$ at the third row.

The electrons thus moved into the quantum dots $QD_1$ are now conducted by tunneling among the quantum dots $QD_1$ in the first row, because the height of the potential barrier is small among these quantum dots $QD_1$ as described before. This conduction of electrons occurs in accordance with the arrangement of quantum dots $QD_1$. Similarly, holes moved into the quantum dots $QD_3$ in the third row are now conducted by tunneling among the quantum dots $QD_3$, because the height of the potential barrier is small among these quantum dots $QD_3$ as described before. This conduction of holes occurs in accordance with the arrangement of quantum dots $QD_3$.

In this case, the electron is different from the hole at least with respect to its effective mass. Also, the height of tunnel barrier against the electron in the quantum dots $QD_1$ is different from the height of tunnel barrier against the hole in the quantum dots $QD_3$. The distribution of electrons in the array of quantum dots $QD_1$ varies in a different way as time passes from the distribution of holes in the array of quantum dots $QD_3$. When the distribution of electrons and holes respectively varies from their initial distribution as follows:

f(x,y)→g(x,y) and f(x,y)→h(x,y), then g(x,y)≠h(x,y). Data processing is thus performed by the conduction of electrons at the quantum dots $QD_1$ and holes at the quantum dots $QD_3$ at the third row.

Figure 8:
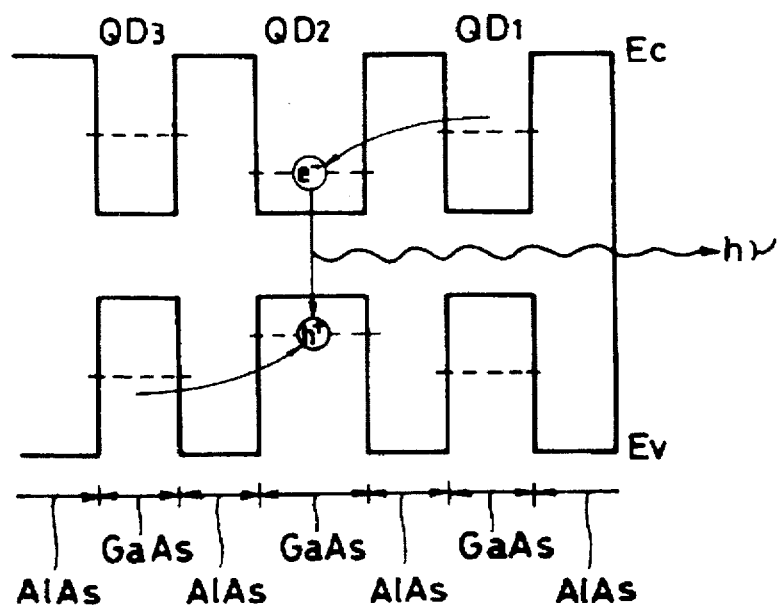
FIG. 8 shows an energy band for the purpose of explaining method for data retrieval out of the collective element of quantum dots shown in FIG. 1.

When the output data is to be retrieved, the bias voltage should be set to zero between the n-type GaAs layer 2 and the electrode on the AlAs layer 10. The energy band along a direction of a line δ in FIG. 1 becomes at this time as shown in FIG. 8. As a result, the quantum level corresponding to a ground state of an electron in the conduction band of the first quantum dots $QD_1$ in the first row is higher than the quantum level corresponding to a ground state of an electron in the conduction band of the second quantum dots $QD_2$ in the second row. Also, the quantum level corresponding to a ground state of a hole in the valence electron band of the third quantum dots $QD_3$ in the third row is higher than the quantum level corresponding to a ground state of a hole in the valence electron band of the second dots $QD_2$ in the second row. Then the electrons in the first quantum dots $QD_1$ at the first row move all at once to the quantum dots $QD_2$ at the second row. Also, the holes in the third quantum dots $QD_3$ at the third row move all at once to the quantum dots $QD_2$ at the second row. As the electrons and holes both exist in the quantum dots $QD_2$, re-coupling between electrons and holes occurs as shown in FIG. 8 and it generates a luminescent (hu). The distribution of luminous intensity, at this time, can be represented by the product between the distribution g(x,y) of electrons in the first quantum dots $QD_1$ at the first row and the distribution h(x,y) of holes in the third quantum dots $QD_3$ at the third row. In other words, the distribution of luminous intensity is represented as follows.

g(x,y)·h(x,y)

And it can be utilized as an output of data. Thus the output distribution of "g(x,y)·h(x,y)" can be obtained from the input distribution of "f(x,y)".

In accordance with this embodiment, the collective element of quantum dots can be realized in which the data entry is performed by irradiating a light into the quantum dots $QD_2$ at the second row, data processing is performed by the conduction of electrons and holes respectively in the array of quantum dots $QD_1$ in the first row and the array of quantum dots $QD_3$ in the third row, and data retrieval is performed by the luminescent from the array of quantum dots $QD_2$ at the second row. Since both electrons and holes are involved in data processing with this collective element of quantum dots, the flexibility of designing this collective element of quantum dots can be increased.

Figure 9:
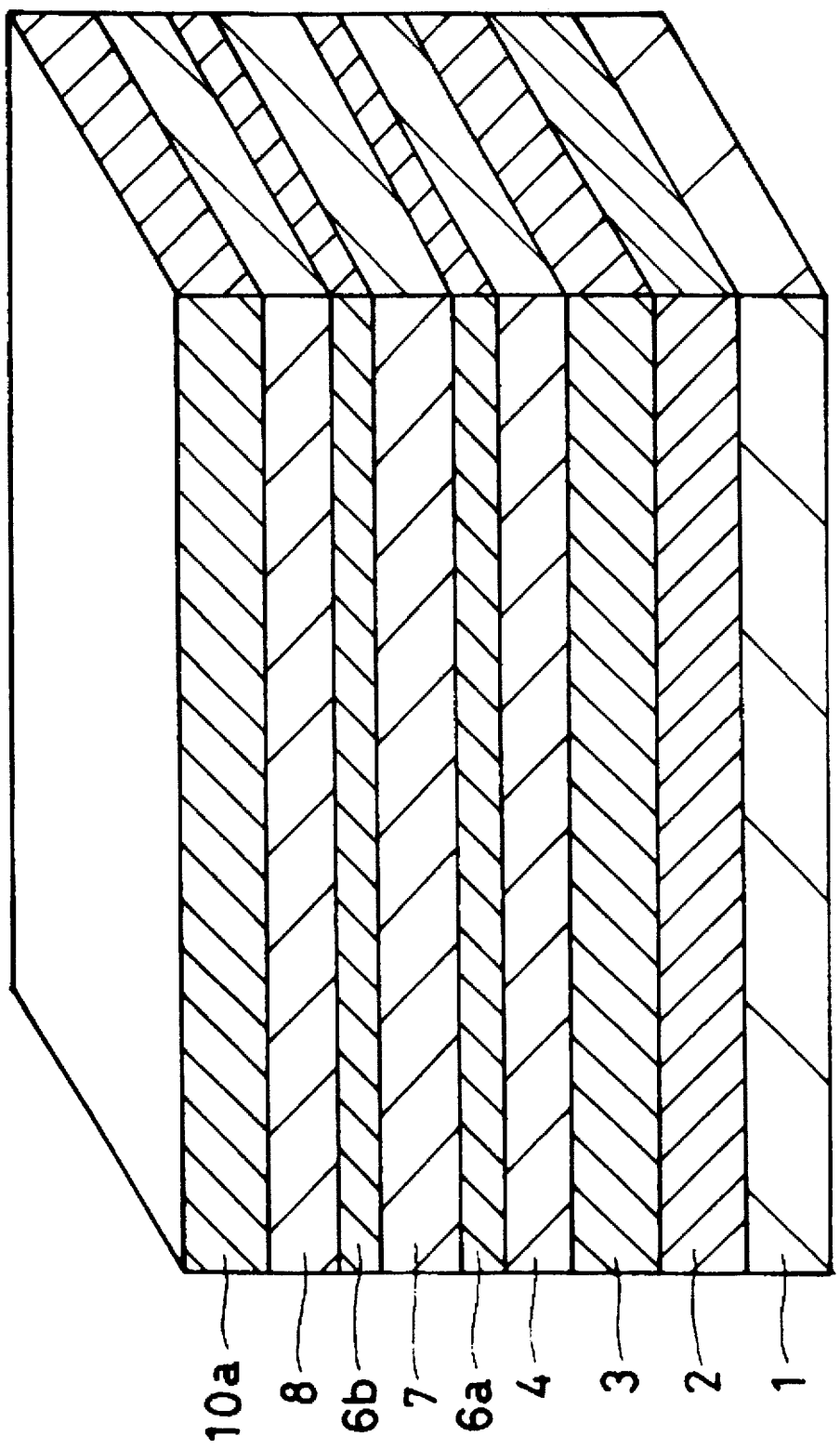
FIG. 9 shows a perspective view for the purpose of explaining manufacturing method of the collective element of quantum dots shown in FIG. 1.

The process for manufacturing the collective element of quantum dots of this embodiment will be explained below. As shown in FIG. 9, the following layers are formed in order on the semi-isolated GaAs substrate i by the epitaxial growth caused by a method such as Metal Organic Chemical Vapor Deposition (MOCVD). They are a n-type GaAs layer 2, an AlAs layer 3, a GaAs layer 4, another AlAs layer 6a, another GaAs layer 7, a further AlAs layer 6b, a further GaAs layer 8 and a still further AlAs layer 10a. The preferred thickness of the n-type GaAs layer 2 and the AlAs layer 3 are respectively around 1000 nm and 100 nm for examples.

Figure 10:
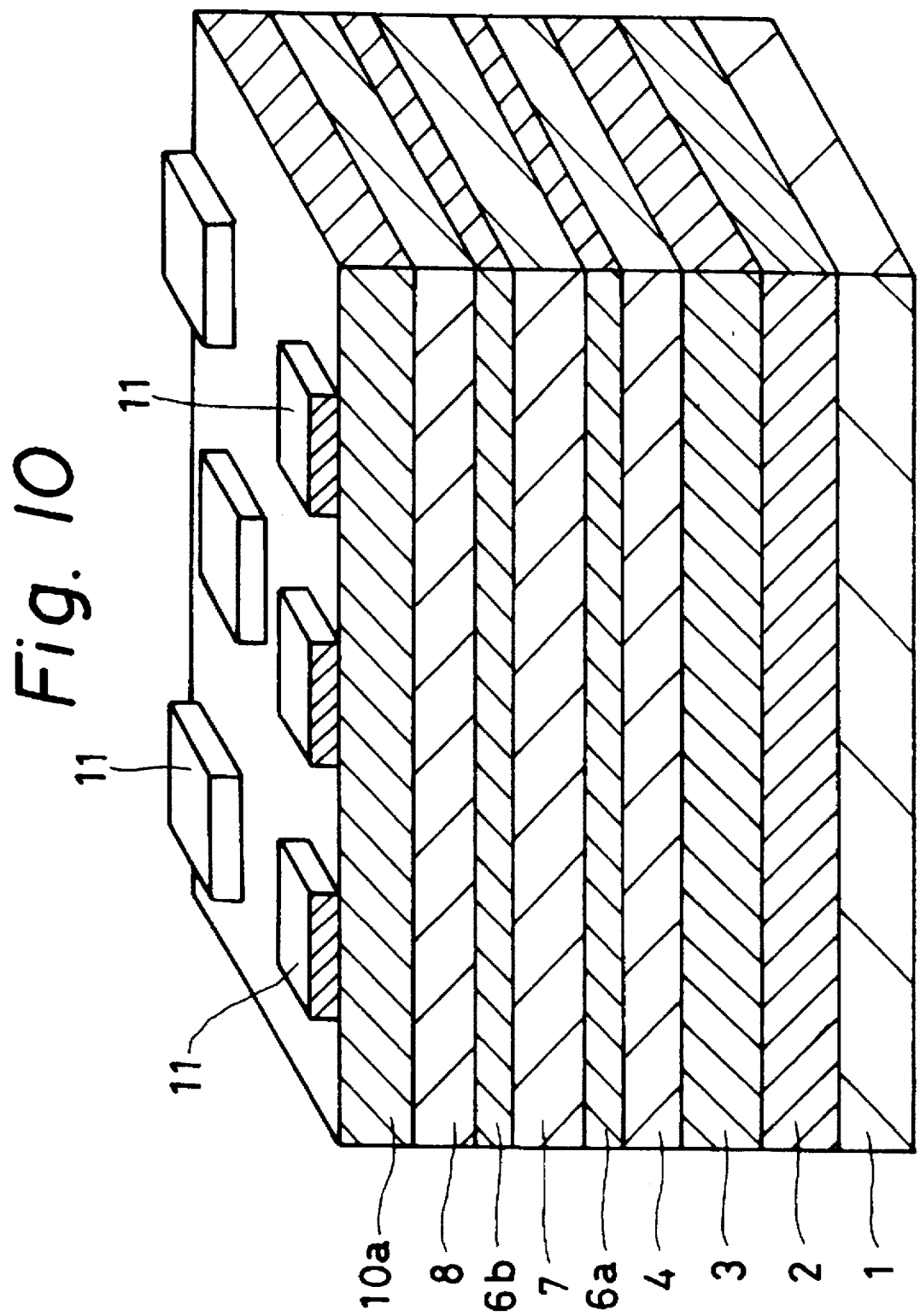
FIG. 10 shows another perspective view for the purpose of explaining manufacturing method of the collective element of quantum dots shown in FIG. 1.
Figure 11:
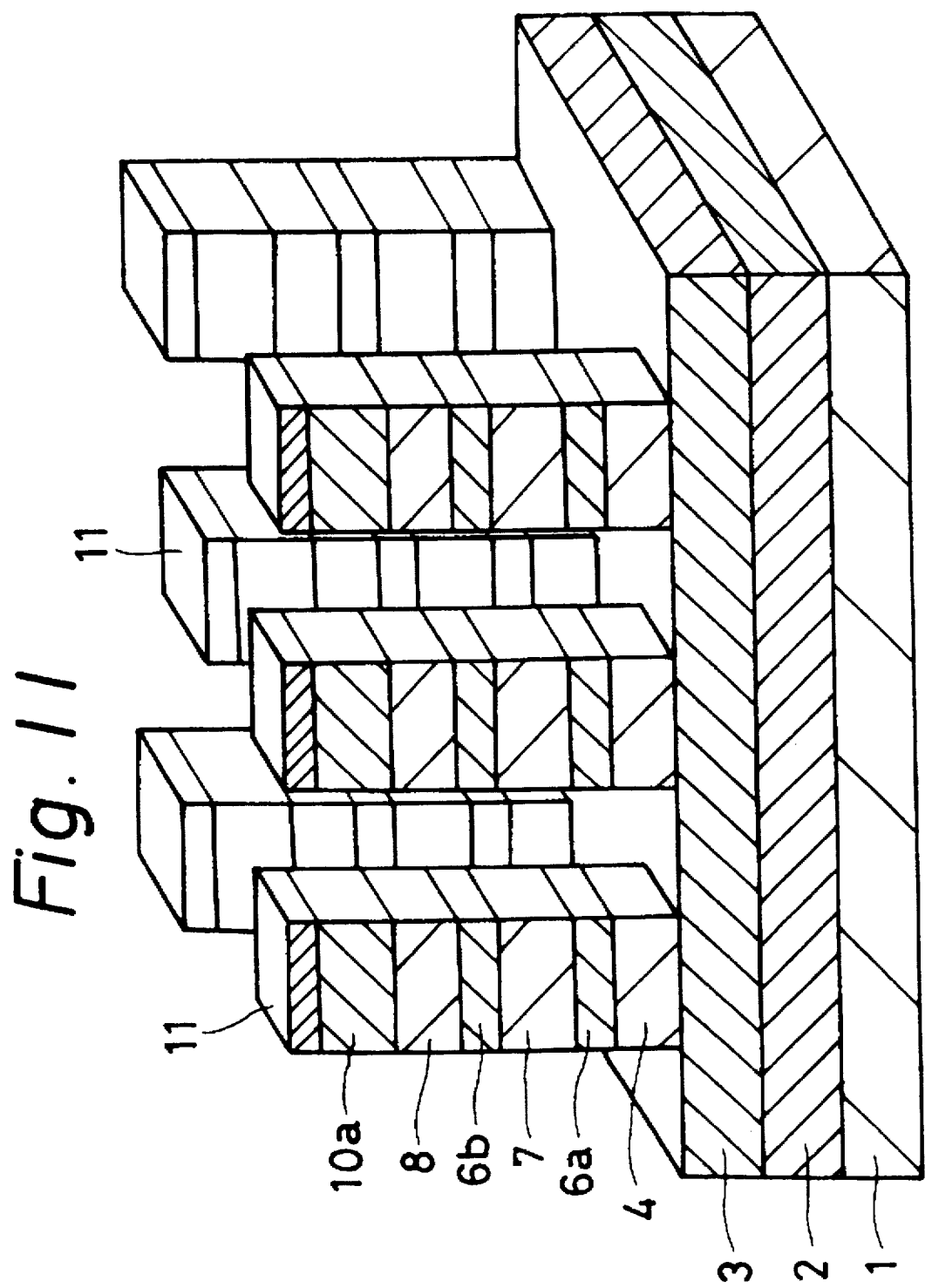
FIG. 11 shows a further perspective view for the purpose of explaining manufacturing method of the collective element of quantum dot shown in FIG. 1.

In accordance with the corresponding shape of the quantum dots $QD_1$, $QD_2$ and $QD_3$ in the first, second and third rows, the resist patterns are deposed on the AlAs layer 10a as shown in FIG. 10. In practice for an example, with a certain material gas which is filled in an evacuated vacuum chamber of the electron beam irradiation apparatus, an electron beam with a spot diameter focussed small enough is irradiated on the AlAs layer 10a. The resist patterns are formed by heaping the decomposed material out of the material gas on this irradiated portions.

Utilizing the resist pattern 11 thus formed as a mask, each of the AlAs layer 10a, GaAs layer 8, AlAs layer 6b, GaAs layer 7, AlAs layer 6a and GaAs layer 4 is etched in order along a direction perpendicular to their surface by means of anisotropic dry etching method Such as a Reactive Ion Etching (RIE) method. This etching should be performed with overetching so that the GaAs layers 4 can be completely separated to each other. Thus the patterns of square poles are respectively formed with the GaAs layer 4, AlAs layer 6a, GaAs layer 7, AlAs layer 6b, GaAs layer 8 and AlAs layer 10a.

Figure 12:
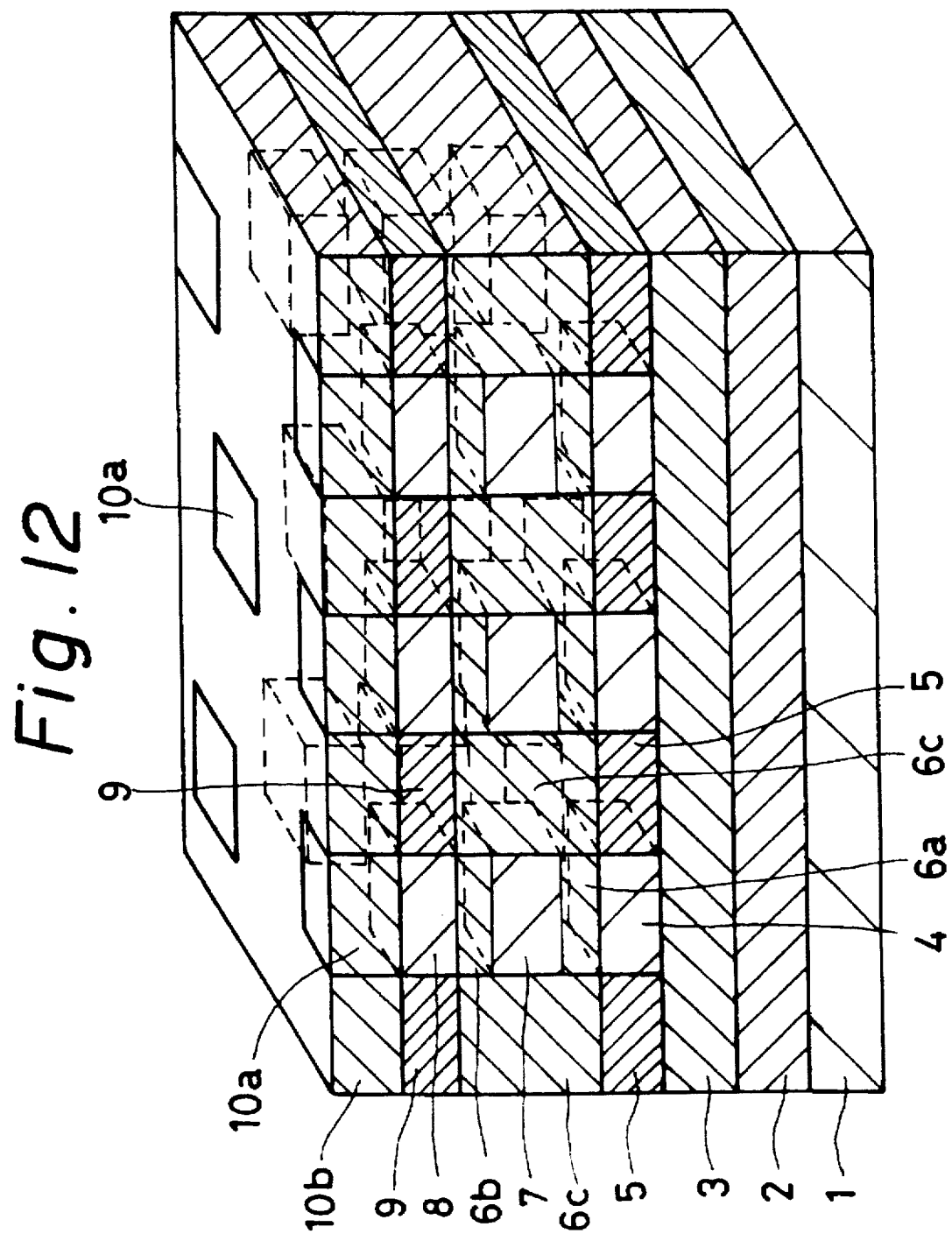
FIG. 12 shows a still further perspective view for the purpose of explaining manufacturing method of the collective element of quantum dot shown in FIG. 1.

Provided that no growth occurs on the inner walls shown in FIG. 12, the AlGaAs layer 5, AlAs layer 6c, AlGaAs layer 9 and AlAs layer 10b are respectively formed in order by the epitaxial growth through the MOCVD method for an example. Space is therefore filled between the patterns of square poles made of the GaAs layer 4, AlAs layer 6a, GaAs layer 7, AlAs layer 6b, GaAs layer 8 and AlAs layer 10a. Thereafter, an electrode (not shown in the drawings) is formed on the AlAs layers 10a and 10b. The collective element of quantum dots is now completed as shown in FIG. 1.

While the invention has been described in conjunction with specific embodiments, it is evident that many alternatives, modifications, permutations and variations will become apparent to those skilled in the art in light of the foregoing description. For an example, the manufacturing process of the collective element of quantum dots was described as an embodiment, but other process can be applied. Though AlGaAs, AlAs and GaAs are utilized as the materials for it, other semi-conductor materials can be also utilized for the collective element of quantum dots or more generally for the collective element of quantum boxes. Accordingly, it is intended that the present invention embrace all such alternatives, modifications and variations as fall within the scope of the appended claims.

What is claimed is:

1. A collective element of quantum boxes comprising:

a plurality of first quantum boxes arranged within a first layer, the first quantum boxes comprising a means for conducting electrons between said first quantum boxes within said first layer;

a plurality of second quantum boxes arranged within a second layer, the second layer located on the first layer, the location of the second quantum boxes being in alignment with the first quantum boxes such that a plurality of locations of the plurality of second quantum boxes within the second layer corresponds with a plurality of locations of said first quantum boxes within the first layer, the second layer comprising a means for substantially preventing the conduction of electrons and holes within the second layer; and a plurality of third quantum boxes arranged within a third layer, the third layer located on the second layer, said third quantum boxes being in alignment with the first quantum boxes such that a plurality of locations of the third quantum boxes within the third layer corresponds with the plurality of locations of said second quantum boxes within the second layer, the plurality of third quantum boxes comprising a means for conducting holes between said third quantum boxes within said third layer.

2. A collective element of quantum boxes in accordance with claim 1 wherein said first, second and third quantum boxes are each respectively made of a superlattice type I hetero junction.

3. A collective element of quantum boxes in accordance with claim 1, further comprising:

means for supplying a bias voltage associated with the collective element of quantum boxes that generates a higher electric potential at said plural first quantum boxes than an electric potential at said plural third quantum boxes; and means for irradiating light in a selected one of said second quantum boxes, said light having a wavelength capable of generating an electron and hole pair in said second quantum box.

4. A collective element of quantum boxes in accordance with claim 3, comprising:

means for supplying a larger bias voltage to move the electron and hole between respective first and third quantum boxes.

5. A collective element of quantum boxes in accordance with claim 4, further comprising:

means for observing luminescence caused by a re-coupling of said electron and hole at a particular one of said second quantum boxes.

6. A method for data processing comprising the steps of:

providing a plurality of first quantum boxes arranged within a first layer, said first quantum boxes comprising a means for conducting electrons between said first quantum boxes within said first layer;

providing a plurality of second quantum boxes arranged within a second layer, the second layer located on the first layer, and wherein a plurality of locations of the second quantum boxes within the second layer are in alignment with a plurality of locations of said first quantum boxes within the first layer such that the plurality of locations of the second quantum boxes within the second layer corresponds with a plurality of locations of the first quantum boxes within the first layer, the second layer comprising a means for substantially preventing the conduction of electrons and holes;

providing a plurality of third quantum boxes arranged within a third layer, the third layer located on the second layer, and wherein a plurality of locations of the plurality third quantum boxes within the third layer are in alignment with the plurality of locations of said second quantum boxes within the second layer, the plurality of third quantum boxes comprising a means for transmitting holes between said third quantum boxes within said third layer;

supplying a bias voltage to provide a higher electric potential at said plural first quantum boxes than a potential at said plural third quantum boxes;

providing a light irradiated into a selected one of said second quantum boxes, said light having a wavelength capable of generating an electron and hole pair in said selected second quantum box;

supplying a larger bias voltage to move the electron and hole of the electron and hole pair into a respective corresponding first and third quantum box;

substantially removing said bias voltage to move the electron and hole to said plural second quantum boxes from said respective plural first quantum boxes and third quantum boxes;

observing luminescence caused by a recoupling of said electron and hole at said respective second quantum boxes.

7. A method for processing data comprising the steps of:

a) providing a semiconductor structure comprising a first layer, the first layer comprised of a first plurality of quantum boxes having a plurality of locations within the first layer, a second layer on the first layer, the second layer comprised of a second plurality of quantum boxes having a plurality of locations within the second layer, the plurality of locations of the second quantum boxes within the second layer being in alignment with the plurality of locations of first quantum boxes within the first layer such that the plurality of locations of second quantum boxes within the second layer corresponds with the plurality of first quantum boxes within the first layer, and a third layer on the second layer, the third layer comprised of a third plurality of quantum boxes having a plurality of locations within the third layer, the plurality of locations of the third quantum boxes within the third layer being in alignment with the plurality of locations of second quantum boxes within the second layer such that the plurality of locations of third quantum boxes within the third layer corresponds with the plurality of second quantum boxes within the second layer;

b) generating at least one electron and at least one hole in a selected one of the second plurality of quantum boxes;

c) moving the at least one electron into the plurality of first quantum boxes and the at least one hole into the third plurality of quantum boxes;

d) transferring the at least one hole between the quantum boxes in the third layer and transferring the at least one electron between the quantum boxes in the first layer; and e) moving the at least one hole and at least one electron back to the second group of quantum boxes and generating an information signal by combining the at least one electron and at least one hole.

* * * * *